(12) United States Patent
Hosotani et al.

(10) Patent No.: US 6,919,595 B2
(45) Date of Patent: Jul. 19, 2005

(54) SEMICONDUCTOR MEMORY DEVICE

(75) Inventors: Keiji Hosotani, Tokyo (JP); Kentaro Nakajima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/951,588

(22) Filed: Sep. 29, 2004

(65) Prior Publication Data

US 2005/0035385 A1 Feb. 17, 2005

Related U.S. Application Data

(62) Division of application No. 10/615,920, filed on Jul. 10, 2003, now Pat. No. 6,803,619.

(30) Foreign Application Priority Data

Jul. 10, 2002 (JP) .................................. 2002-201166

(51) Int. Cl.[7] .............................................. H01L 29/76
(52) U.S. Cl. .................. 257/295; 257/298; 257/303; 257/306; 257/324; 438/3; 438/240
(58) Field of Search .................... 257/68, 71, 295–314, 257/324–326; 438/3, 240

(56) References Cited

U.S. PATENT DOCUMENTS

| | | | |
|---|---|---|---|
| 6,349,054 B1 * | 2/2002 | Hidaka | ........................ 365/173 |
| 6,518,588 B1 | 2/2003 | Parkin et al. | |
| 6,529,404 B2 * | 3/2003 | Hidaka | ........................ 365/171 |
| 6,587,370 B2 | 7/2003 | Hirai | |
| 6,590,244 B2 | 7/2003 | Asao et al. | |
| 6,664,579 B2 | 12/2003 | Kim et al. | |
| 2002/0041515 A1 | 4/2002 | Ikeda et al. | |

OTHER PUBLICATIONS

R. Scheuerlein, et al, ISSCC 2000 / Session 7 / TD: Emerging Memory & Device Technologies / Paper TA 72, pp. 94–95, "TA 7.2: A 10NS Read and Write Non–Volatile Memory Array Using A Magnetic Tunnel Junction and Fet Switch In Each Cell", 2000.

* cited by examiner

*Primary Examiner*—Andy Huynh
(74) *Attorney, Agent, or Firm*—Oblon, Spivak, McClelland, Maier & Neustadt, P.C.

(57) ABSTRACT

A magnetic memory device capable of achieving high reliability and superior operation characteristics of tunneling magneto-resistive (TMR) elements is provided. This magnetic memory device includes a semiconductor substrate, a transistor which is formed above the semiconductor substrate, and a TMR element which is formed on or above an interlayer dielectric film that covers the transistor of the substrate. The device also includes a first wiring line which is buried in the interlayer dielectric film and connected to a source/drain diffusion layer of the transistor, a second wiring line which is buried under the TMR element while overlying the first wiring line within the interlayer dielectric film and which is used to apply a current-created magnetic field to the TMR element during writing, and a third wiring line connected to an upper surface of the TMR element and provided to cross the second wiring line. The third wiring line is for applying a current magnetic field to the TMR element during writing and also for causing a cell current to flow during reading. The second wiring line is formed by patterning techniques so that its both edges are placed outside of a pattern of the TMR element.

3 Claims, 9 Drawing Sheets

SEMICONDUCTOR MEMORY DEVICE

This application is a DIV of Ser. No. 10/615,920 filed Jul. 10, 2003 U.S. Pat. No. 6,803,619.

CROSS-REFERENCE TO PRIOR APPLICATION

This application is based upon and claims the benefit of priority from the prior Japanese Patent Application No. 2002-201166, filed on Jul. 10, 2002, the entire content of which is incorporated herein by reference.

BACKGROUND OF THE INVENTION

1. Field of the Invention

This invention relates to non-volatile magnetic memory devices using tunneling magneto-resistive (TMR) elements to achieve electromagnetic write and read capabilities.

2. Description of Related Art

Nonvolatile memory devices which electromagnetically perform data writing and reading include magnetic random access memory (MRAM) devices. To realize random accessing capabilities, MRAMs are typically designed to include rows and columns of electrical wiring lines, also known as "current magnetic field" lines. The rows of wiring lines cross over the columns of wiring lines at right angles to thereby provide a matrix of crossing points, with magneto-resistance effect elements laid out at the crossing points. By selecting one from among the rows of current magnetic field wiring lines while simultaneously selecting a column wiring line in a one-by-one manner, it is possible to read or write any given magnetic storage cell or bit.

Conventionally, the mainstream in the MRAM technology lies in memory cells using giant magneto-resistive (GMR) elements. Unfortunately, in a GMR element, a magneto-resistance (MR) ratio—a ratio of a resistance value when data "1" is written into a cell, to that when a data "0" is written into the cell—stays as small as several percent (%), which is not sufficient to attain high performance memories. In contrast, tunneling magnetoresistive (TMR) operability at room temperature was confirmed in 1996, followed by the ascertainment of MR ratios over 40% at room temperature. Since then, the trend in MRAM cell research and investigation has shifted at a burst to TMR elements.

Typically a TMR element is designed to have a magnetic tunnel junction (MTJ) structure. This MTJ structure includes two magnetic layers—usually, ferromagnetic (FM) layers—sandwiching a insulating tunnel barrier layer. Binary information stored in the TMR element is defined by determining whether the spin directions of the two magnetic layers are parallel or anti-parallel to each other. Note here that the term "parallel" used in this context, and hereinafter, refers to a state that the two magnetic layers are identically the same in spin direction as each other, whereas the term "antiparallel" means that these layers are exactly opposite in spin direction to each other.

One of current magnetic field wiring lines which intersect with a TMR element interposed therebetween is an write word line, which serves for applying current magnetic field to the TMR element in a non-contact fashion. The other is an data select line (bit line), which is electrically connected to an electrode of the TMR element. Data writing is accomplished by causing current to flow in the write word line and the data select line and then setting the spin direction of a TMR element in either the parallel or the antiparallel state by a magnetic field as created by the current flowing in the both lines. Data read is done by detecting the value of a current flowing in a data select line to thereby sense that the TMR element is different in resistance depending upon the data being presently stored therein.

Great interest at present in research and development of MRAM devices is centered on establishment of advanced technologies that enable MRAMs using TMR elements stated above to be reduced to practice as LSI memory products. But many technical obstacles remain before TMR-MRAM chips will become practical. One representative obstacle to be overcome is the difficulty in providing a technique for fabricating a tunnel barrier layer which is as thin as 1 nanometer (nm) while guaranteeing increased reliability and, at the same time, ensuring well-stabilized TMR element operability. More specifically, in order to combine LSI technologies that have long been developed as silicon processes, and TMR film fabrication technologies that have been developed mainly for magnetic head applications, it is required to improve irregularity formed on an underlayer film during silicon processes to a level acceptable for a TMR film to be formed on the underlayer film.

FIG. 9 illustrates, in cross-section, an integrated structure of a conventional TMR-MRAM chip, which is found in R. Scheuerlein et al., IEEE International Solid-State Circuits Conference (ISSCC) 2000, Digest of Technical Papers, p. 128. The TMR-MRAM structure of FIG. 9 includes TMR elements each of which is connected to a transistor formed above a silicon substrate 1, although such transistors are not visible in the cross-section shown herein. Electrical wire leads 3 are the ones that continuously pattern the gate electrodes of the transistors. These wire leads 3 are on an element isolation dielectric film 2 in the cross-section of FIG. 9. These leads 3 are for use as read word lines (R-WL).

The TMR elements VR are formed on an interlayer dielectric film 4 at locations overlying the transistors. The interlayer dielectric film 4 is such that a plurality of wiring layers are buried therein. A wiring lead 7 that is connected to upper surfaces of the TMR elements VR is for use as a read and write-use bit line (R/W-BL). A wiring lead 6a that is buried immediately beneath each TMR element VR is a write word line (W-WL), which is designed to extend perpendicular to the wiring lead 7.

The individual TMR element VR has its lower electrode 8, which is drawn to outside of the region of this TMR element VR for electrical interconnection with the source/drain diffusion layer of a transistor. This lower electrode 8 is connected to the transistor's source/drain diffusion layer, through a contact plug 9 and also via relay wire 6b and 5.

In the TMR-MRAM structure shown in FIG. 9, the width of each TMR element VR (width of magnetic tunnel junction or "MTJ") and the width of the wire lead 6a which applies a write current magnetic field to this junction from its lower part are made almost equal to each other in order to minimize the resulting cell area. Unfortunately in LSI processes, misalignment can occur due to the execution of alignment of physically different layers during lithography steps. In FIG. 9, there is shown an example that the patterns of a TMR element VR and its underlying wire 6a are misaligned and offset by a degree corresponding to almost half of the width thereof. To facilitate the understanding of its influence, a part encircled by dotted line in FIG. 9 is enlargedly depicted in a sectional diagram of FIG. 10.

After having formed the TMR element VR's lower write-use wire lead 6a, its upper part is covered with the interlayer dielectric film 4. However, a slant stair-step-like height difference portion remains at edge of wire 6a in most cases.

The step-like difference portion typically measures several to several tens of nm. Creation of this step-like surface irregularity is unavoidable even when using methods for forming by patterning techniques the wires on or above the interlayer dielectric film or alternatively using methods for forming grooves in the interlayer dielectric film and then burying wire metals therein. And, such step-like surface difference is not completely "absorbed" even after deposition of an interlayer dielectric film thereon, resulting in appearance of a similar step-like surface configuration thereover—in other words, this portion is "inherited" as an underlayer step-like difference of TMR element VR. TMR element VR has two magnetic layers 11 and 13 with a tunnel barrier layer 12 sandwiched therebetween. This tunnel barrier 12 is an ultrathin film with its thickness of about 1 nm as stated previously. Thus, the presence of such underlayer step difference can seriously affect the reliability and operation characteristics of the tunnel barrier film.

Although in the TMR-MRAM cell structure of FIG. 10 the problem due to the step-like difference caused by the write-use wire lead 6a immediately underlying the TMR element VR is discussed, recall that this wire 6a also associates its further underlying electrical wiring components, including transistor terminal connection leads 5 and gate wiring leads 3 as shown in FIG. 9. These wiring lead patterns experience unwanted creation of similar step-like difference portions at their edges. These step differences also hardly disappear completely even after completion of multilayer wiring processes and can affect the operability and reliability of the TMR elements involved.

As apparent from the foregoing, the currently available approach to achieving MRAM devices using TMR elements is encountered with a problem that the risk of misalignment. between TMR elements and their underlying electrical wiring leads affects the reliability and operation characteristics of the TMR elements.

SUMMARY OF THE INVENTION

A magnetic memory device in accordance with one aspect of this invention includes a semiconductor substrate, a transistor formed above said semiconductor substrate, a tunnel magneto-resistive element formed above an interlayer dielectric film covering said transistor of said semiconductor substrate, a first wiring line buried in said interlayer dielectric film and connected to a source/drain diffusion layer of said transistor, a second wiring line buried under said tunnel magneto-resistive element while overlying said first wiring line in said interlayer dielectric film, to provide a current magnetic field to said tunnel magneto-resistive element during writing, and a third wiring line connected to an upper surface of said tunnel magneto-resistive element and provided to cross said second wiring line, to provide a current magnetic field to said tunnel magneto-resistive element during writing and also to cause a cell current to flow during reading, wherein said second wiring line is formed and patterned so that its both edges are placed outside the pattern of said tunnel magneto-resistive element.

A magnetic memory device in accordance with another aspect of the invention includes a semiconductor substrate, a transistor formed above the substrate, a tunnel magnetoresistive element formed above an interlayer dielectric film covering the transistor of the substrate, a first wiring line buried in the interlayer dielectric film and connected to a source/drain diffusion layer of the transistor, a second wiring line buried under the tunnel magneto-resistive element while overlying the first wiring line in the interlayer dielectric film, to provide a current magnetic field to the tunnel magnetoresistive element during writing, and a third wiring line connected to an upper surface of the tunnel magnetoresistive element and provided to cross the second wiring line, to provide a current magnetic field to the tunnel magnetoresistive element during writing and to cause a cell current to flow during reading, wherein all of element regions including all wiring lines including the first and second wiring lines formed under the tunnel magnetoresistive element above the substrate, a gate wiring line of the transistor, one or more wiring contacts and the source/drain diffusion layer are formed by patterning so that edges thereof are placed outside of a region immediately underlying the tunnel magnetoresistive element.

DETAILED DESCRIPTION OF THE EMBODIMENTS

Embodiments of this invention will be explained with reference to the accompanying drawings below.

Embodiment 1

Figure 1:
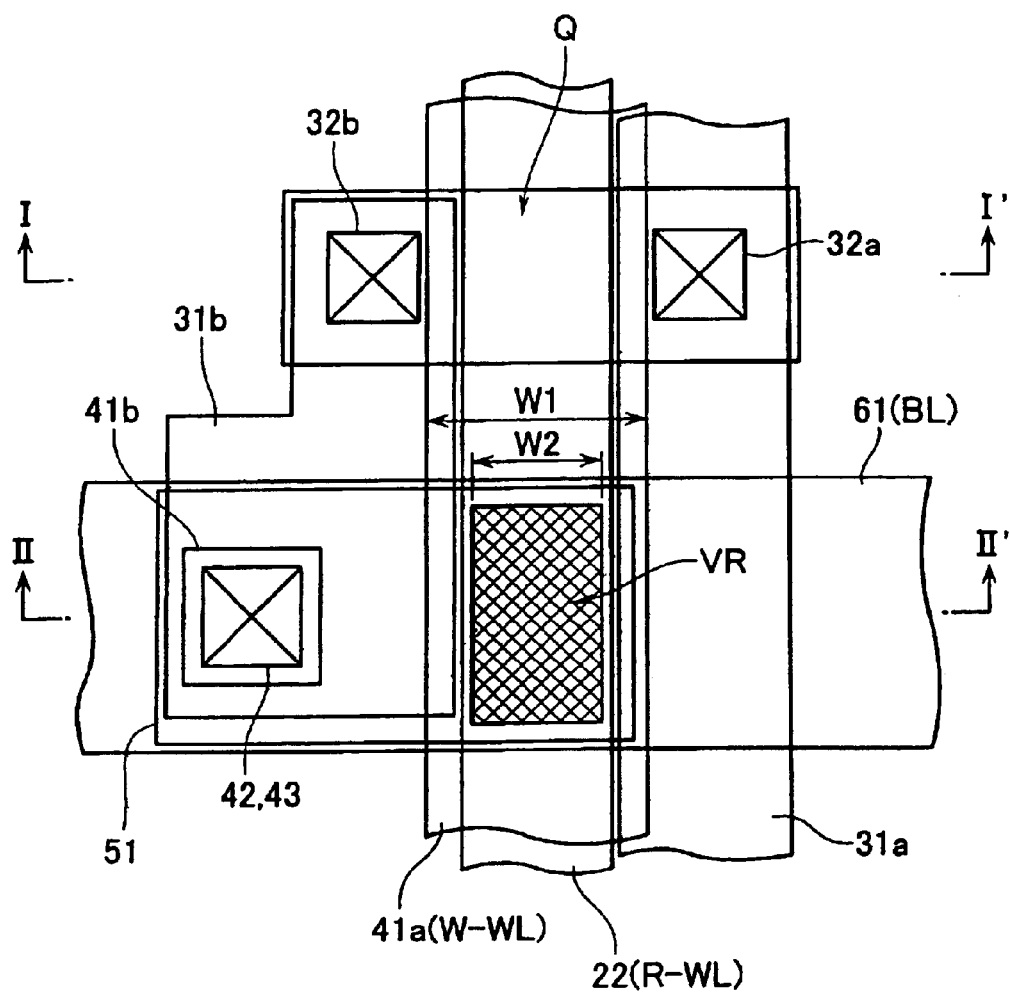
FIG. 1 is a diagram showing a layout pattern of an MRAM cell in accordance with an embodiment 1 of this invention.
Figure 2A:
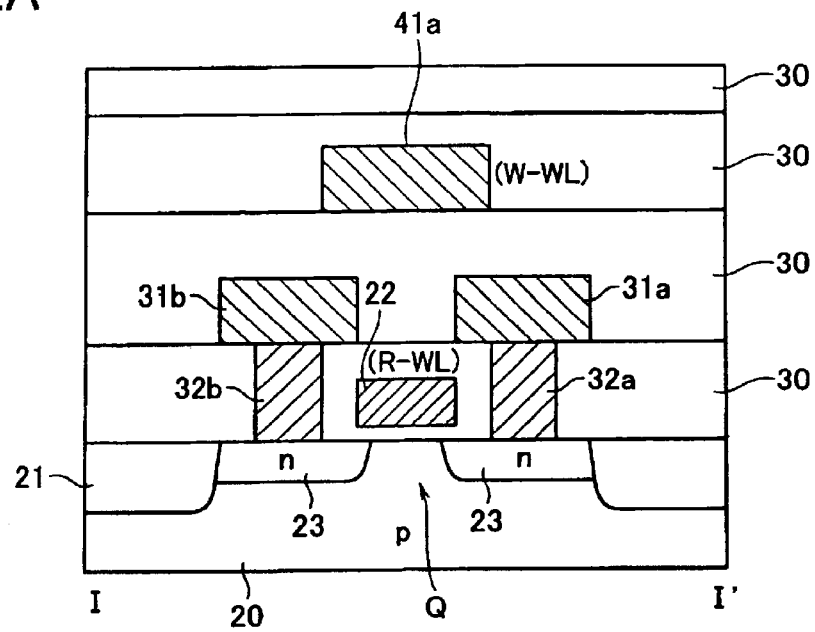
FIG. 2A is a cross-sectional view of the cell as taken along line I–I' of FIG. 1.
Figure 2B:
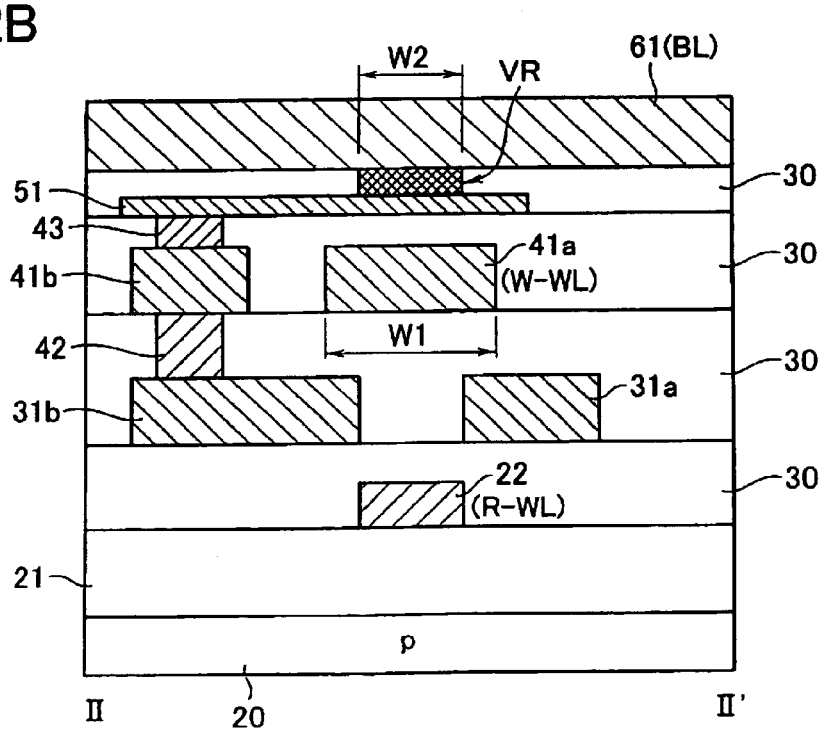
FIG. 2B is a sectional view of the cell taken along line II–II' of FIG. 1.

FIG. 1 depicts a plan view of one cell unit of a magnetic random access memory (MRAM) chip in accordance with an embodiment 1 of the invention. FIG. 2A shows a cross-sectional view of the cell as taken along line I–I' of FIG. 1, while FIG. 2B is a sectional view of it along line II–II' of FIG. 1. The memory cell is structured from an N-channel metal oxide semiconductor (NMOS) transistor Q and a tunneling magneto-resistive (TMR) element VR. The NMOS transistor Q is formed on a silicon substrate 20. The TMR element VR is stacked over this transistor Q and is connected in series thereto.

The silicon substrate 20 has its top surface which is subdivided or partitioned by a patterned element isolating dielectric film 21 into a plurality of element regions, with an NMOS transistor Q formed in each element region. Transistor Q has its gate electrode 22 which is provided as a read word line (R-WL) that extends continuously in one direction. Transistor Q is covered or coated with an interlayer dielectric film 30, on which electrical wiring leads 31 (31a, 31b) made of first-layer metals are formed by patterning techniques. These wire leads 31a and 31b are connected to source and drain diffusion layers 23 through contact plugs 32a and 32b that are buried in interlayer dielectric film 30, respectively. One of the wires 31—that is, 31a—is a source wiring lead. The other wire 31b is a relay lead for connecting a drain of transistor Q to the TMR element VR. As shown in FIG. 1, this relay lead 31b is patterned to extend from the region of transistor Q up to a specific region of the element isolation region in-which TMR element VR is formed.

The wiring leads 31a–31b are coated at their top surfaces with another interlayer dielectric film 30, on which wiring leads 41 (41a, 41b) made of second-layer metals are formed. The wire lead 41a is placed immediately beneath the TMR element VR and is for use as a write word line W-WL for giving to TMR element VR a magnetic field created by a current flowing therein—say, current magnetic field. This write wordline is designed to extend in parallel to the read wordline 22. The wire lead 41b is a relay lead which is used to electrically further extend the above-stated relay lead 31b up to the TMR element VR. This lead 41b is connected via a contact plug 42 to relay lead 31b.

The wire leads 41a–41b are covered at top surfaces with still another interlayer dielectric film 30, on which a lower electrode 51 of the TMR element VR. This lower electrode 51 is extended to outside of the TMR element region and is connected to the relay lead 41b via a contact plug 43. The TMR element VR is formed on this lower electrode 51 so that it positions immediately above the write word line 41. TMR element VR has a three-layer magnetic tunnel junction (MTJ) structure comprising upper and lower ferromagnetic (FM) layers with a thin tunnel barrier layer interposed therebetween. One of these FM layers is for use as a magnetic hard layer with its spin direction being fixed or "pinned," whereas the other FM layer acts as a storage layer.

The TMR element VR is formed so that it is buried in the interlayer dielectric film 30 that covers the lower electrode 51. On this film 30, a wiring lead 61 made of a third-layer metal is formed and connected to an upper surface of TMR element VR. This lead 61 is continuously formed in a direction perpendicular to the write word line 41 and is for use as a data select line, that is, bit line BL.

As shown in FIGS. 1 and 2B, this embodiment is arranged so that the write word line 41a being formed just below the TMR element VR has a width w1 which is greater than a width w2 of TMR element VR by a degree equivalent to an alignment margin. With such an arrangement, even when a certain degree of alignment failure or misalignment occurs, the opposite edges of write wordline 41a are placed outside of the pattern of TMR element VR. In other words, TMR element VR will no longer overlap the edges of write wordline 41a in any way. Thus it is possible to improve the reliability of TMR element VR having the thin tunnel barrier layer, which in turn makes it possible to obtain excellent operation characteristics.

Embodiment 2

In the previous embodiment 1, the opposing edges of the first-layer metal wiring lines 31 (relay wire lead 31b and source lead 31a) overlap the side edges of the write word line 41a of the second-layer metal as shown in FIG. 2B. Even though the TMR element VR does not overlie the edges of its immediately underlying write wordline 41a, there is a risk that the influence of an edge step difference of the leads 31 at a further lower level reaches the TMR element VR.

Figure 3:
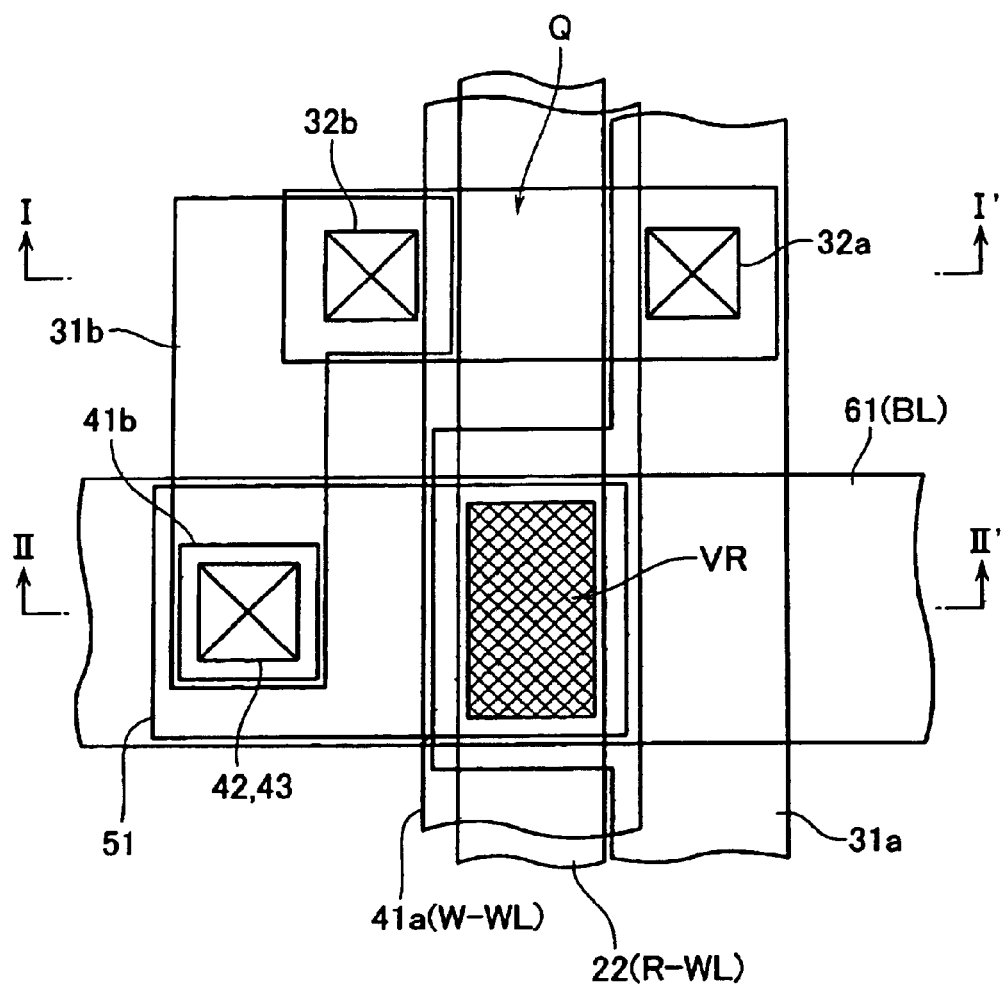
FIG. 3 is a diagram showing the layout of an MRAM cell in accordance with an embodiment 2 of this invention.
Figure 4A:
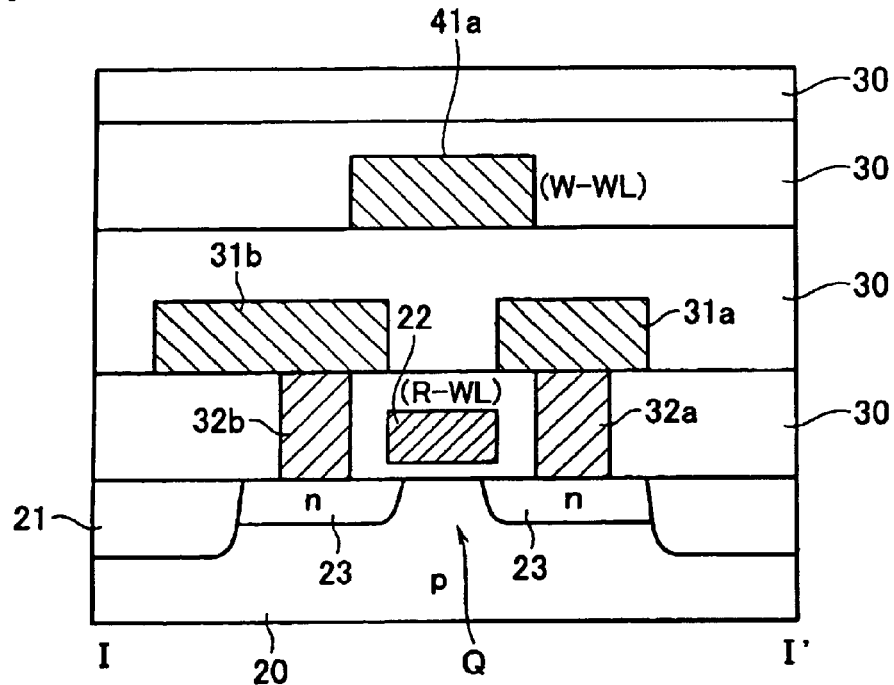
FIG. 4A is a cross-sectional view of the cell as taken along line I–I' of FIG. 3.
Figure 4B:
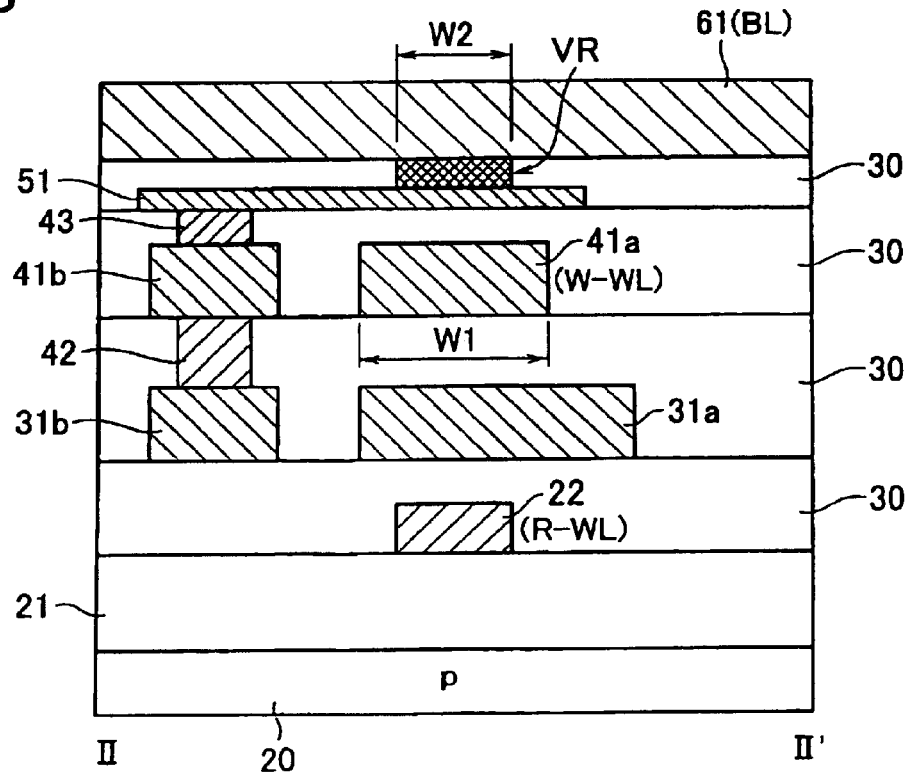
FIG. 4B is a sectional view taken along line II–II' of FIG. 3.

FIG. 3 shows the layout of a cell of a second embodiment which eliminates such influence also. FIGS. 4A and 4B are cross-sectional views of the cell as taken along line I–I' and II–II' of FIG. 3, respectively. Parts or components corresponding to those of the previous embodiment 1 are denoted by the same reference characters used in the previous embodiment 1, and detailed explanations thereof are omitted herein.

In this embodiment the replay-use wire lead 31b of the first-layer metal wiring leads 31 is formed at a specified location spaced far from a region that immediately underlies the TMR element VR. Additionally the source lead 31a is made larger in width so that this lead has an edge which is exactly aligned with a corresponding edge of its overlying write wordline 41a in the region immediately underlying the TMR element VR. The relation of the width w2 of TMR element VR and the width w1 of write wordline 41a and source lead 31a is set so that the latter is greater than the former (w1>w2) in a similar way to the previous embodiment.

Employing this wiring lead layout enables successful removal of the edge step difference influence to TMR element VR of not only the write wordline 41a immediately underlying the TMR element VR but also the source lead 31a underlying the write wordline 41a. This makes it possible to permit the underlayer of TMR element VR to become more excellent in surface planarity, which in turn enables further improvement in reliability and operation characteristics of TMR element VR.

Embodiment 3

In the embodiment 2 stated above, the read wordline 22 which is the gate wiring lead that further underlies the second-layer metal leads 31a and 41a residing just beneath the TMR element VR is formed to have a width narrower than that of the metal leads 31a–41a; thus, there is a risk that its step-like difference can affect the TMR element VR.

Figure 5:
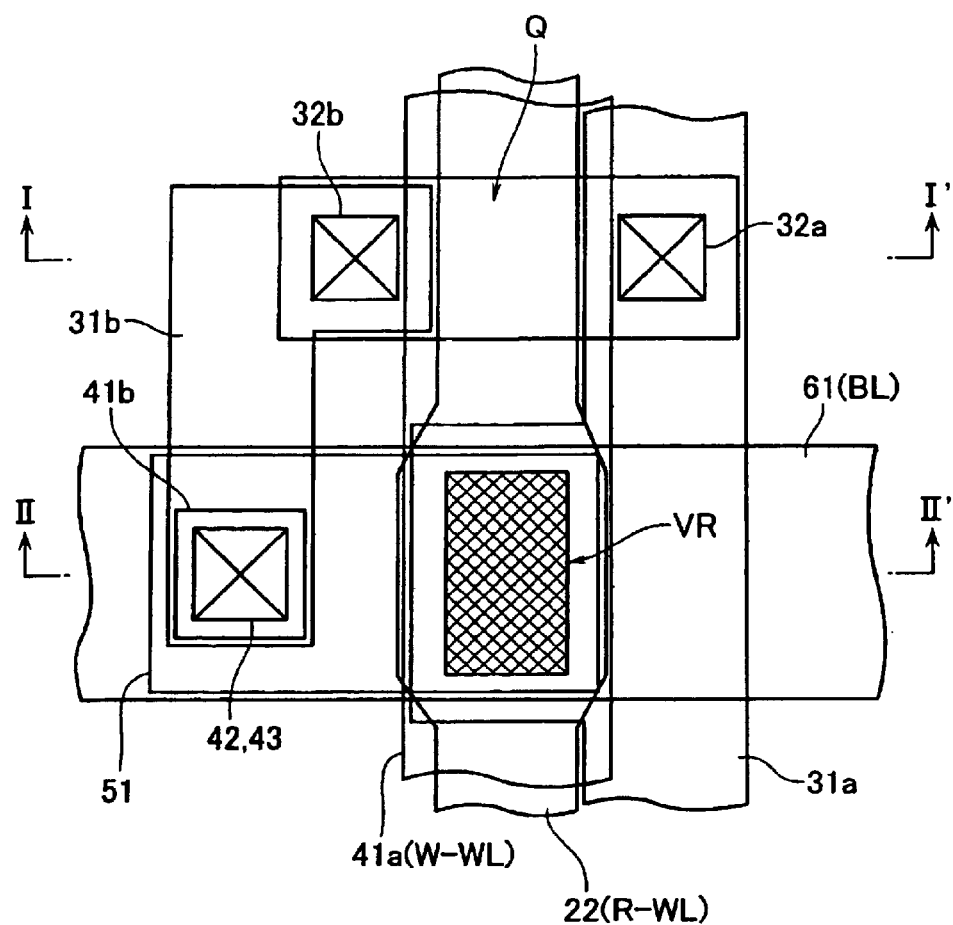
FIG. 5 is a diagram showing the layout of an MRAM cell in accordance with an embodiment 3 of this invention.
Figure 6A:
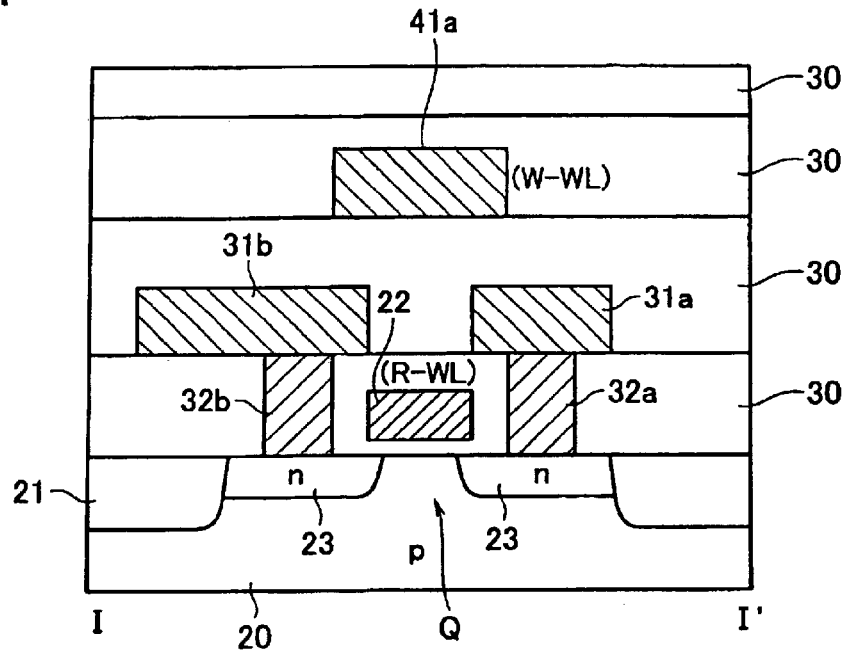
FIG. 6A is a sectional view of the cell as taken along line I–I' of FIG. 5.
Figure 6B:
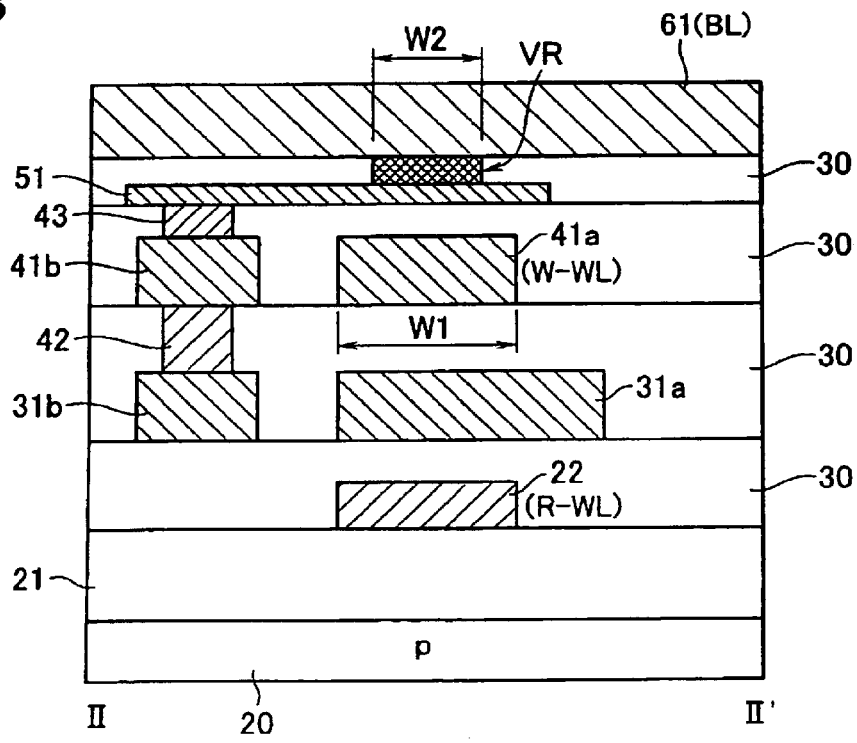
FIG. 6B is a sectional view along line II–II' of FIG. 5.

FIG. 5 shows the layout of a cell of a third embodiment which removes such influence also, and FIGS. 6A and 6B are cross-sectional views of the cell as taken along line I–I' and II–II' of FIG. 5, respectively. Parts or components corresponding to those of the previous embodiments 1 and 2 are denoted by the same reference characters used in the these embodiments 1–2, with detailed explanations thereof omitted herein.

In this embodiment 3, the read wordline 22 which is formed by extending the gate electrode of transistor Q is specifically arranged so that this wordline is partly widened at least in the region immediately underlying the TMR element VR and passes the location just beneath the TMR element VR while having substantially the same width w1 as that of the write wordline 41a being formed thereabove.

With such an arrangement, the surface planarity of the underlayer of TMR element VR become further excellent. This in turn makes it possible to achieve further improvements in reliability and operation characteristics of TMR element VR.

Another advantage of this embodiment is that since the width of the read wordline is increased in width at the part above the element isolation region, it becomes possible to lower the electrical resistivity of the read wordline. This makes it expectable to obtain increased read speeds and/or improved signal-to-noise (S/N) ratios.

Embodiment 4

Although the approach of letting the read word line partly increase in width in the TMR element region is a one method, another effective method is to form the read wordline by patterning techniques in such a way that it extends while avoiding direct passage through the region immediately underlying the TMR element VR. In brief, let the read wordline skirt this region.

Figure 7:
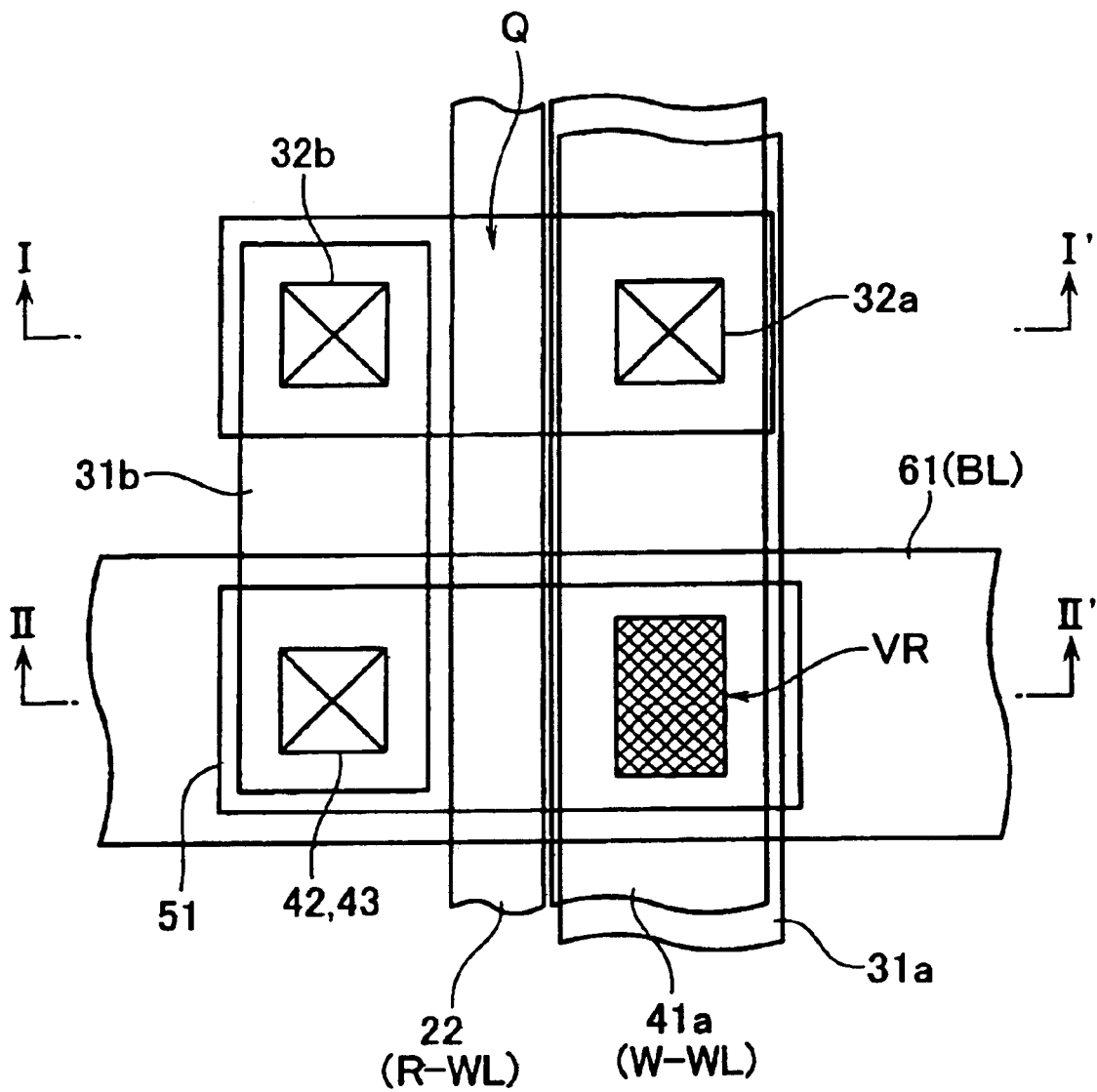
FIG. 7 is a diagram showing the layout of an MRAM cell in accordance with an embodiment 4 of the invention.
Figure 8A:
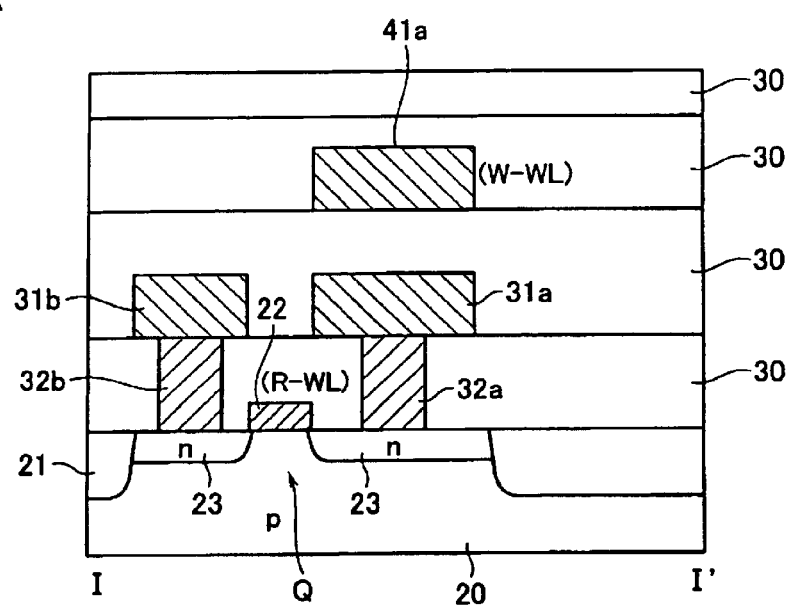
FIG. 8A is a sectional view of the cell taken along line I–I' of FIG. 7.
Figure 8B:
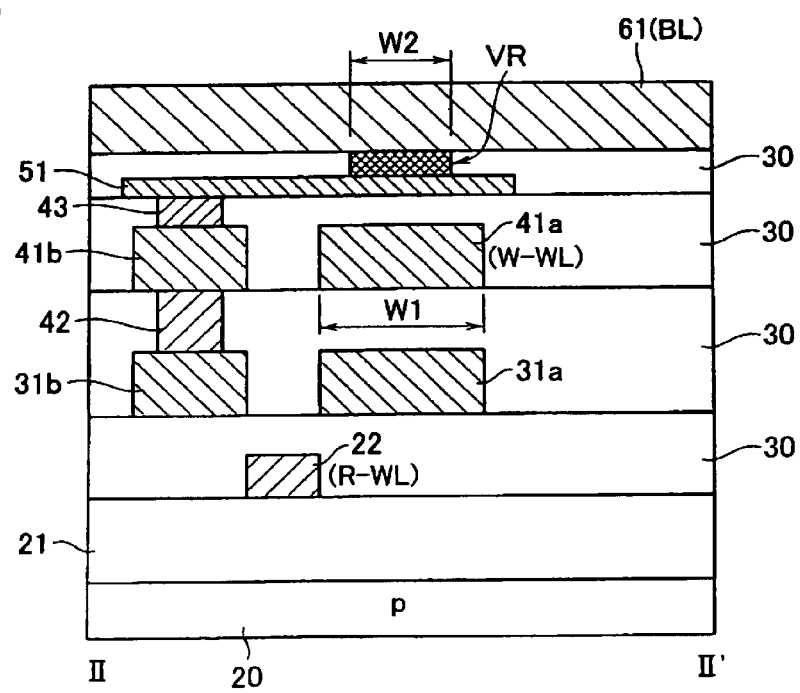
FIG. 8B is a sectional view along line II–II' of FIG. 7.
Figure 9:
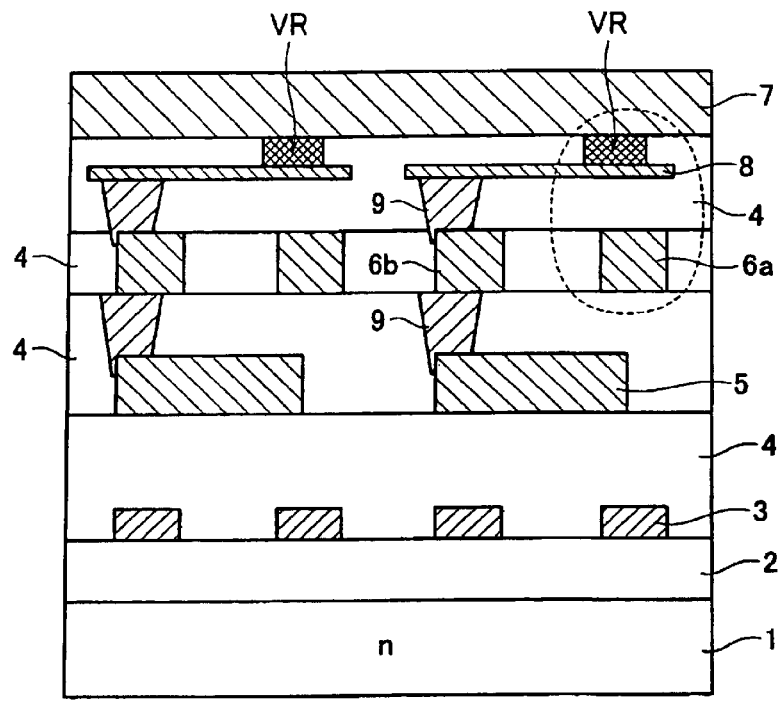
FIG. 9 is a sectional view of one prior known MRAM cell.
Figure 10:
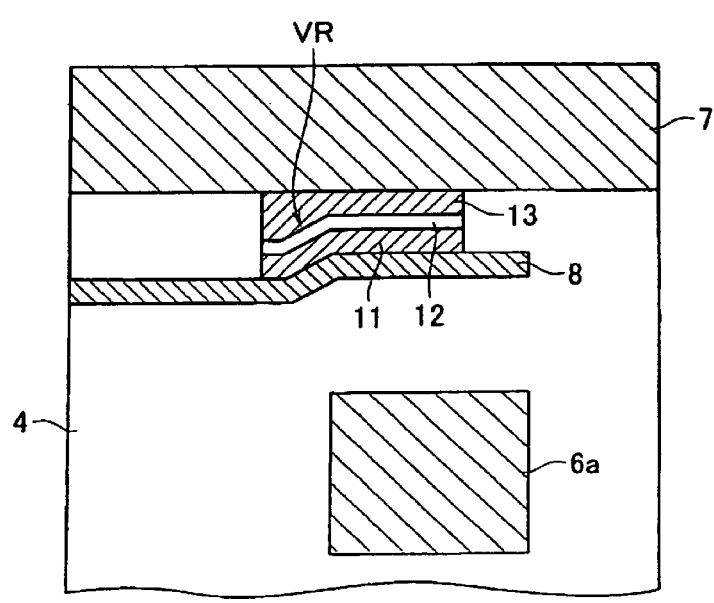
FIG. 10 is an enlarged sectional view of main part of the cell shown in FIG. 9.

FIG. 7 shows the layout of a cell of an embodiment 4 employing such design scheme. FIGS. 8A and 8B are sectional views of the cell as taken along line I–I' and II–II' of FIG. 7, respectively. Parts or components corresponding to those of each of the previous embodiments 1–3 are denoted by the same reference characters used in each previous embodiment, with detailed explanations thereof omitted herein.

As shown in the drawings, in this embodiment, the read wordline 22 that is the gate wiring lead is patterned so that it passes a location departing from the region immediately underlying the TMR element VR while retaining a constant width. More specifically, this wordline overlaps none of the source lead 31a and the write wordline 41a which are the first- and second-layer metal wiring leads. And, with respect to the TMR element VR, let its underlying source lead 31a and write wordline 41a pass in the state that these are greater in width than TMR element VR—that is, in the state that both edges are placed outside of the TMR element VR.

Whereby, the underlayer of the TMR element VR becomes further excellent in surface planarity, which in turn makes it possible to further improve the reliability and operation characteristics of the TMR element VR.

In the embodiments 2 and 3, all the patterns to be formed beneath the TMR element VR above the silicon substrate 20—namely, the first- and second-layer metal wiring leads, gate leads, lead contacts, and patterns of element regions including source/drain diffusion layers—are arranged so that their edges are placed outside of the region immediately underlying the TMR element VR. With the patterning scheme unique to the invention, the underlayer of any TMR element may be improved in surface planarity, thus enabling the TMR element to improve both in reliability and in operation characteristics.

What is claimed is:

1. A magnetic memory device comprising:
   a semiconductor substrate;
   an interlayer dielectric film formed on said semiconductor substrate;
   a tunnel magneto-resistive element formed above said interlayer dielectric film;
   a first wiring line buried in said interlayer dielectric film just beneath said tunnel magneto-resistive element to provide a current magnetic field to said tunnel magneto-resistive element during writing; and
   a second wiring line connected to an upper surface of said tunnel magneto-resistive element and provided to cross said first wiring line, to provide a current magnetic field to said tunnel magneto-resistive element during writing and also to cause a cell current to flow during reading; and
   a lead placed just beneath said first wiring line having a width greater than that of said first wiring line,
   wherein said first wiring line is formed and patterned so that both edges of the first wiring line are placed outside a pattern of said tunnel magneto-resistive element.

2. A magnetic memory device as depicted in claim 1, wherein said lead has a wider width beneath the first wiring line, than in other regions.

3. A magnetic memory device as depicted in claim 1, wherein said lead has an edge aligned with an edge of the first wiring line in a region underneath the tunnel magneto-resistive element.

* * * * *